(12) United States Patent
Kamakura

(10) Patent No.: US 9,549,481 B2
(45) Date of Patent: Jan. 17, 2017

(54) METHOD FOR PRODUCING BASE SUBSTRATE, METHOD FOR PRODUCING ELECTRONIC DEVICE, BASE SUBSTRATE, AND ELECTRONIC APPARATUS

(71) Applicant: Seiko Epson Corporation, Tokyo (JP)

(72) Inventor: Tomoyuki Kamakura, Matsumoto (JP)

(73) Assignee: Seiko Epson Corporation (JP)

( * ) Notice: Subject to any disclaimer, the term of this patent is extended or adjusted under 35 U.S.C. 154(b) by 622 days.

(21) Appl. No.: 13/922,622

(22) Filed: Jun. 20, 2013

(65) Prior Publication Data

US 2014/0003004 A1 Jan. 2, 2014

(30) Foreign Application Priority Data

Jul. 2, 2012 (JP) ................................ 2012-148512

(51) Int. Cl.
*H05K 1/03* (2006.01)
*H05K 7/00* (2006.01)
*H05K 1/18* (2006.01)
*H05K 3/30* (2006.01)
*H03H 9/10* (2006.01)
*H05K 3/24* (2006.01)
*H03H 9/05* (2006.01)
*H05K 3/32* (2006.01)

(52) U.S. Cl.
CPC .............. *H05K 7/00* (2013.01); *H03H 9/1021* (2013.01); *H05K 1/18* (2013.01); *H05K 3/246* (2013.01); *H05K 3/30* (2013.01); *H01L 2224/16225* (2013.01); *H03H 9/0509* (2013.01); *H05K 1/0306* (2013.01); *H05K 3/321* (2013.01); *H05K 2201/0347* (2013.01); *H05K 2201/10083* (2013.01); *H05K 2201/10371* (2013.01); *H05K 2203/1131* (2013.01); *H05K 2203/1147* (2013.01); *Y10T 29/4913* (2015.01); *Y10T 29/49117* (2015.01)

(58) Field of Classification Search
CPC ..................................... H05K 1/18; H05K 3/30
USPC ................................ 174/250, 255–257, 259
See application file for complete search history.

(56) References Cited

U.S. PATENT DOCUMENTS

2003/0096059 A1 5/2003 Suzuki et al.
2004/0121179 A1 6/2004 Kirsten
2004/0135247 A1 7/2004 Takashima et al.
(Continued)

FOREIGN PATENT DOCUMENTS

CN 1636253 A 7/2005
JP 06-045283 2/1994
(Continued)

*Primary Examiner* — Tremesha S Willis
(74) *Attorney, Agent, or Firm* — Harness, Dickey & Pierce, P.L.C.

(57) ABSTRACT

A method for producing a base substrate includes preparing an insulator substrate; forming a first film containing, as a main component, a metal that contains at least one of tungsten and molybdenum and has a melting point of 1000° C. or higher on the insulator substrate; forming a second film containing nickel as a main component and also containing boron on the first film; forming a first metal layer by performing a sintering treatment of the first film and the second film; and forming a second metal layer containing palladium as a main component on the first metal layer.

6 Claims, 13 Drawing Sheets

(56) References Cited

U.S. PATENT DOCUMENTS

| | | | |
|---|---|---|---|
| 2005/0243141 A1* | 11/2005 | Shaarawi | B41J 2/1603 347/63 |
| 2009/0186215 A1 | 7/2009 | Sato et al. | |
| 2011/0227661 A1 | 9/2011 | Numata et al. | |
| 2013/0014979 A1* | 1/2013 | Uzoh | H01R 13/03 174/257 |

FOREIGN PATENT DOCUMENTS

| | | |
|---|---|---|
| JP | 06-268260 | 9/1994 |
| JP | 10-270831 A | 10/1998 |
| JP | 11-186431 A | 7/1999 |
| JP | 2003-152145 A | 5/2003 |
| JP | 2003-155575 A | 5/2003 |
| JP | 2003-297158 A | 10/2003 |
| JP | 2004-127953 A | 4/2004 |
| JP | 2004-200644 A | 7/2004 |
| JP | 2005-252121 A | 9/2005 |
| JP | 2006-086480 A | 3/2006 |
| JP | 2007-063042 A | 3/2007 |
| TW | 200952048 A | 12/2009 |
| TW | 201139315 A | 11/2011 |

* cited by examiner

METHOD FOR PRODUCING BASE SUBSTRATE, METHOD FOR PRODUCING ELECTRONIC DEVICE, BASE SUBSTRATE, AND ELECTRONIC APPARATUS

BACKGROUND

1. Technical Field

The present invention relates to a method for producing a base substrate, a method for producing an electronic device, a base substrate, and an electronic apparatus.

2. Related Art

There has been known an electronic device having a structure in which, for example, a functional device such as an oscillating device is housed in a package. There has also been known a package having a structure in which a base substrate having a recess and a lid covering the opening of the recess are bonded to each other through a bonding layer (a solder material).

In such an electronic device, in order to hermetically seal the internal space of a package, a lid is hermetically bonded to a base substrate. As the bonding method, for example, bonding by laser welding, seam welding, bonding with a low melting point glass, or the like is used. Such bonding by laser welding or the like is performed, for example, as follows. A bonding layer (a metalized layer) is formed on abase substrate, a lid is superimposed over this bonding layer, the bonding layer is irradiated with a laser from the lid side in this state to melt the bonding layer, whereby the lid is bonded to the base substrate through the bonding layer (see, for example, JP-A-2007-63042).

The bonding layer is configured such that an underlayer is formed from W, Mo, Ag, or an alloy thereof, a metal layer of Ni or Ni—P is formed on the underlayer by electroless plating, a metal layer of Pd or Pd—P is formed thereon, and a metal layer of Au is further formed thereon.

However, a crack occurs in such a bonding layer when performing laser welding, resulting in generating a gap in the bonding layer or between the bonding layer and the base substrate, and therefore, a problem arises such that it is difficult to ensure airtightness in the recess.

SUMMARY

An advantage of some aspects of the invention is to provide a method for producing a base substrate, a method for producing an electronic device, a base substrate, and an electronic apparatus, with which the occurrence of a crack in a bonding layer when bonding a base substrate and a lid to each other through the bonding layer can be prevented, and airtightness of an internal space can be maintained.

The invention can be implemented as the following forms or application examples.

Application Example 1

This application example of the invention is directed to a method for producing a base substrate including: preparing an insulator substrate; forming a first film containing, as a main component, a metal that contains at least one of tungsten and molybdenum and has a melting point of 1000° C. or higher on the insulator substrate; forming a second film containing nickel as a main component and also containing boron on the first film; forming a first metal layer by performing a sintering treatment of the first film and the second film; and forming a second metal layer containing palladium as a main component on the first metal layer.

According to this application example, a thermal change of a bonding layer can be suppressed by suppressing outgassing from plating of the bonding layer or a change in crystallinity due to a thermal effect occurring at the time of welding such as laser welding or seam welding, and therefore, a base substrate, with which the occurrence of a crack in the bonding layer when bonding the base substrate and a lid to each other through the bonding layer can be prevented, and airtightness of an internal space can be maintained is obtained.

Further, by forming the second metal layer containing palladium as a main component, when the base substrate and the lid are bonded to each other through the bonding layer, the second metal layer functions as a barrier layer, and therefore nickel in a lower layer of the second metal layer can be prevented from moving to an upper layer of the second metal layer. As a result, the formation of a nickel oxide on the bonding layer can be prevented. Accordingly, airtightness of an internal space can be maintained without losing the wettability of a solder material on the bonding layer.

Application Example 2

In the method for producing a base substrate according to the application example of the invention, it is preferred that the method further includes forming a third metal layer containing nickel and boron and having a thickness of 0.5 μm or less on the first metal layer after performing the sintering treatment and before forming the second metal layer, and the second metal layer is formed on the third metal layer.

According to this application example, the thickness of the bonding layer can be increased.

Application Example 3

In the method for producing a base substrate according to the application example of the invention, it is preferred that the concentration of boron in the second film is 3% by mass or less.

According to this application example, the occurrence of a crack in the bonding layer when bonding the base substrate and the lid to each other through the bonding layer can be more reliably prevented.

Application Example 4

In the method for producing a base substrate according to the application example of the invention, it is preferred that the method further includes forming a fourth metal layer containing gold on the second metal layer.

According to this application example, the wettability of the bonding layer can be enhanced.

Application Example 5

In the method for producing a base substrate according to the application example of the invention, it is preferred that the concentration of a component other than palladium in the second metal layer is 5% by mass or less.

According to this application example, the function of the second metal layer as the barrier layer can be enhanced.

Application Example 6

This application example of the invention is directed to a method for producing an electronic device including: preparing an insulator substrate; forming a first film containing, as a main component, a metal having a melting point of 1000° C. or higher on the insulator substrate; forming a second film containing nickel as a main component and also containing boron on the first film; forming a first metal layer by performing a sintering treatment of the first film and the second film; forming a second metal layer containing palladium as a main component on the first metal layer, thereby obtaining a base substrate; placing an electronic component on the base substrate; and bonding a lid to the base substrate through the first metal layer and the second metal layer.

According to this application example, a thermal change of a bonding layer can be suppressed by suppressing outgassing from plating of the bonding layer or a change in crystallinity due to a thermal effect occurring at the time of welding such as laser welding or seam welding, and therefore, an electronic device having high reliability, with which the occurrence of a crack in the bonding layer when bonding the base substrate and the lid to each other through the bonding layer can be prevented, and airtightness of an internal space can be maintained is obtained.

Further, by forming the second metal layer containing palladium as a main component, when the base substrate and the lid are bonded to each other through the bonding layer, the second metal layer functions as a barrier layer, and therefore nickel in a lower layer of the second metal layer can be prevented from moving to an upper layer of the second metal layer. As a result, the formation of a nickel oxide on the bonding layer can be prevented. Accordingly, airtightness of an internal space can be maintained without losing the wettability of a solder material on the bonding layer.

Application Example 7

This application example of the invention is directed to a base substrate, which is produced by the method for producing a base substrate according to the application example of the invention and includes: an insulator substrate; a first metal layer, in which a metal having a melting point of 1000° C. or higher and a metal containing nickel as a main component and also containing boron are diffused in each other to form an alloy, on the insulator substrate; and a second metal layer containing palladium as a main component on the first metal layer.

According to this application example, the occurrence of a crack in a bonding layer when bonding the base substrate and a lid to each other through the bonding layer can be prevented, and also the formation of a nickel oxide on the bonding layer can be prevented, and as a result, airtightness of an internal space can be maintained.

Application Example 8

This application example of the invention is directed to an electronic device including: the base substrate according to Application Example 7; an electronic component placed on the base substrate; and a lid fixed to the base substrate through the first metal layer and the second metal layer.

According to this application example, an electronic device having high reliability is obtained.

Application Example 9

This application example of the invention is directed to an electronic apparatus including the electronic device according to Application Example 8.

According to this application example, an electronic apparatus having high reliability is obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a method for producing a base substrate, a method for producing an electronic device, a base substrate, and an electronic apparatus of the invention will be described in detail based on preferred embodiments shown in the accompanying drawings.

First Embodiment

Figure 1:
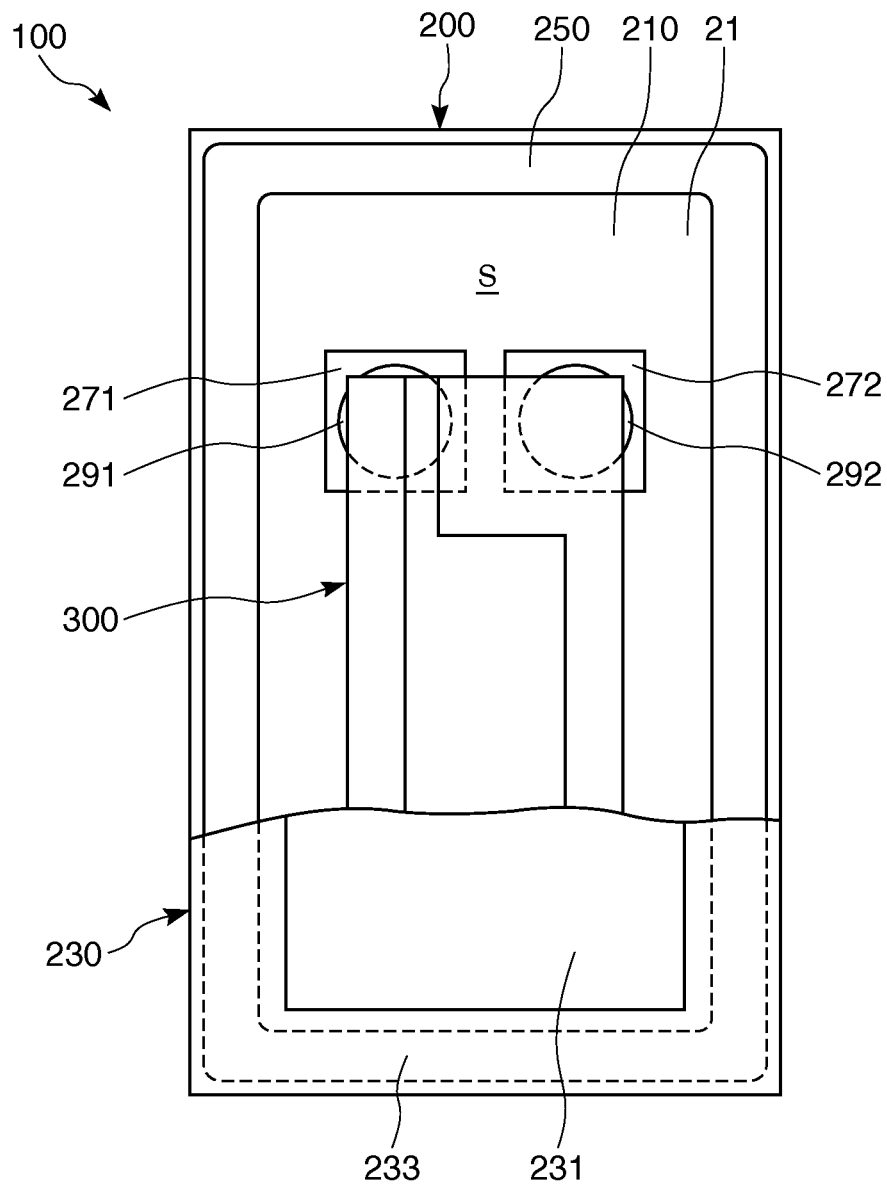
FIG. 1 is a plan view of an electronic device according to a first embodiment of the invention.
Figure 2:
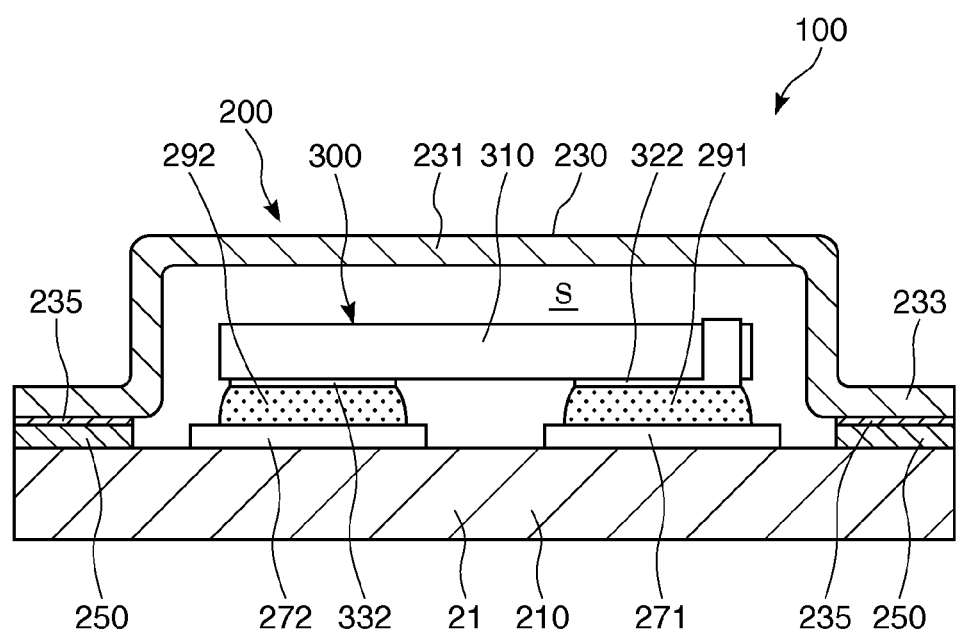
FIG. 2 is a cross-sectional view of the electronic device shown in FIG. 1.
Figure 3A:
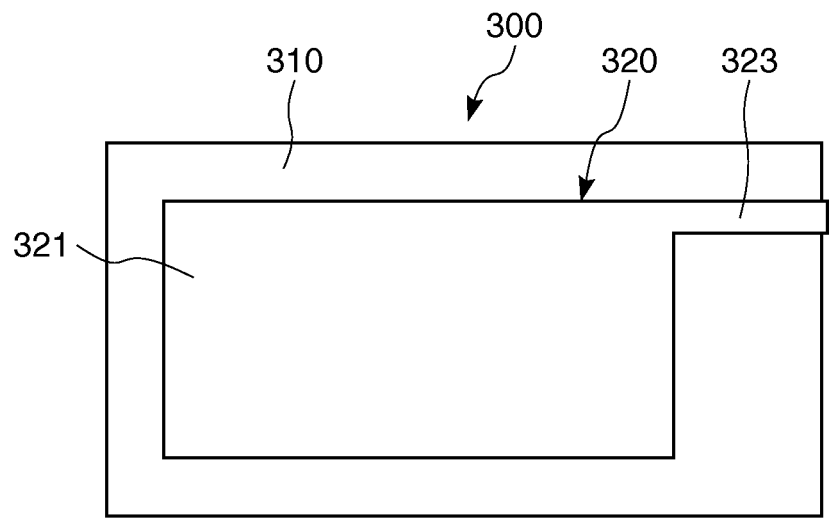
FIGS. 3A and 3B are plan views of an oscillating device of the electronic device shown in FIG. 1.
Figure 3B:
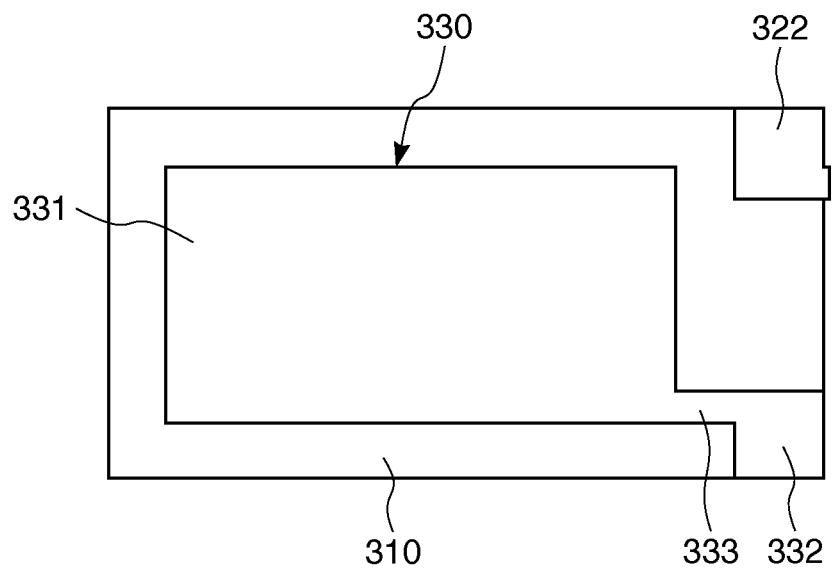
Figure 4:
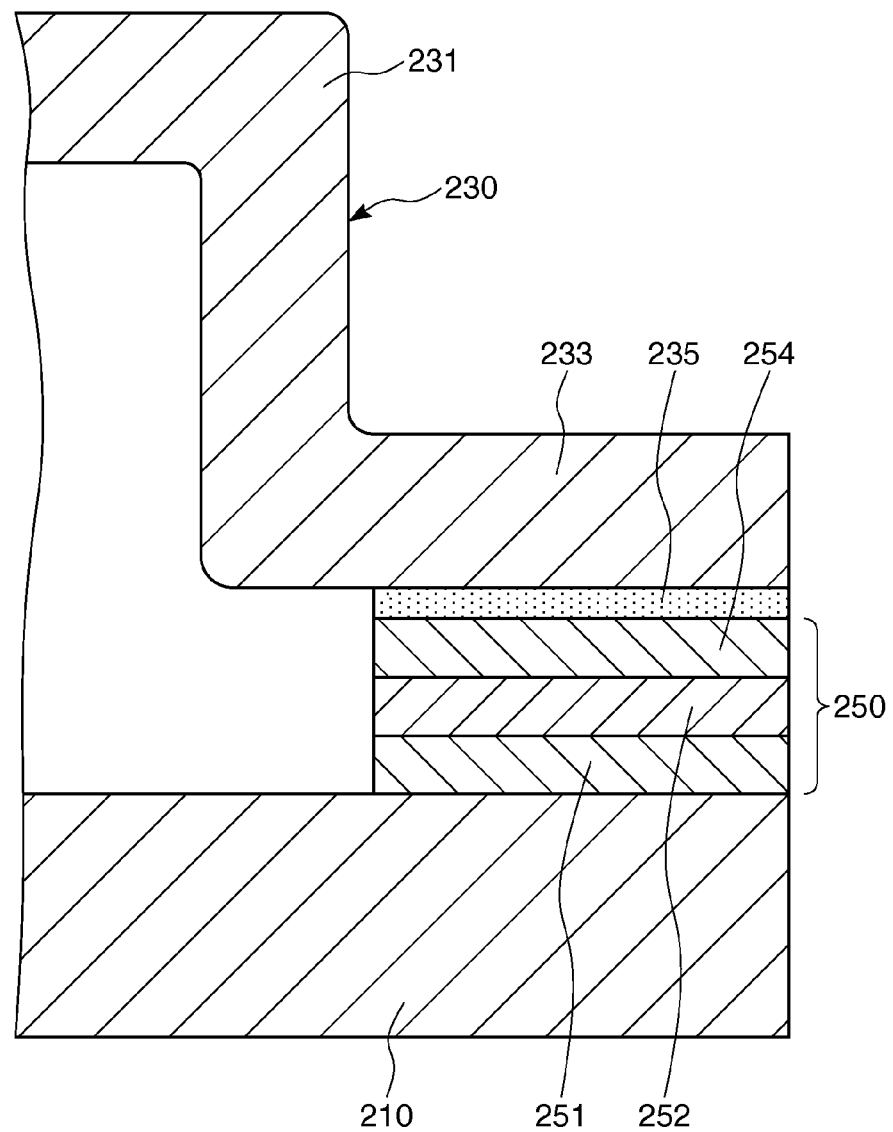
FIG. 4 is an enlarged partial cross-sectional view of the electronic device shown in FIG. 1.
Figure 5:
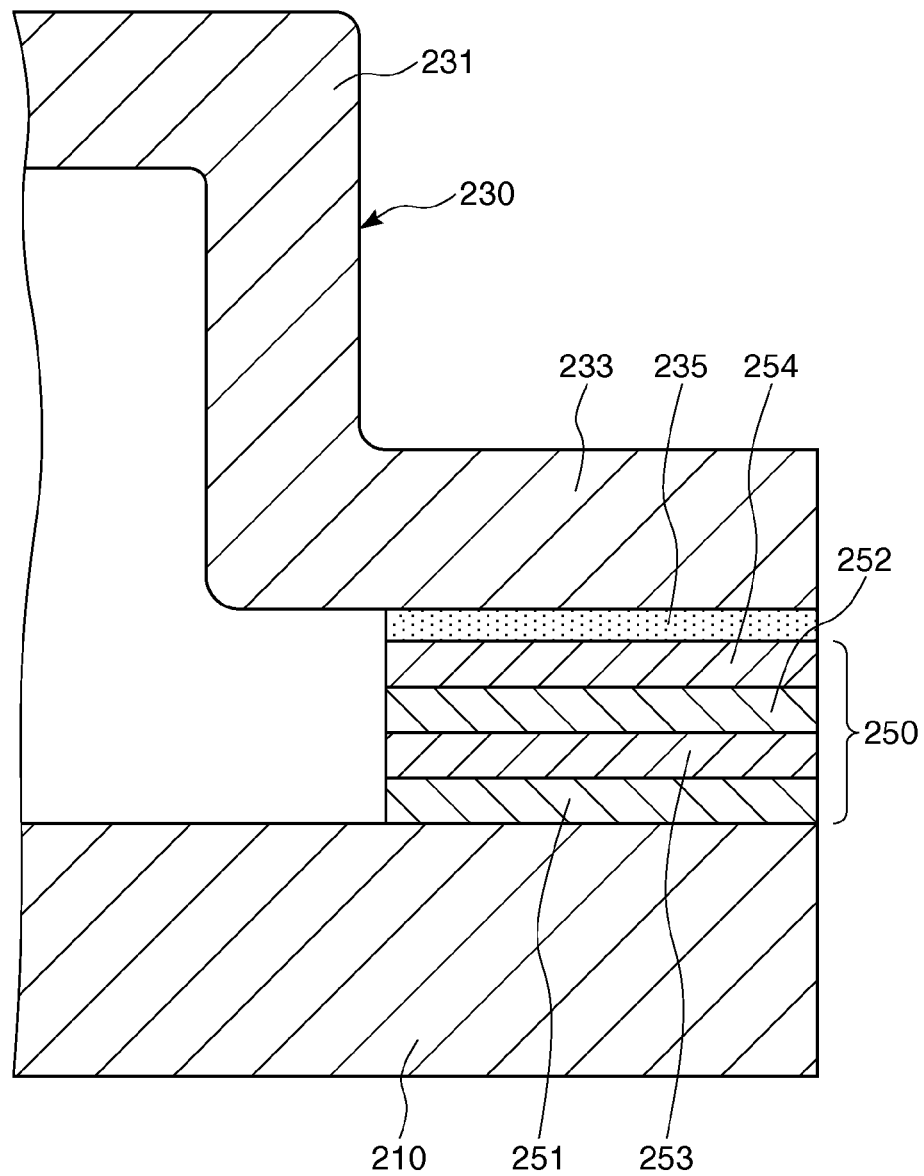
FIG. 5 is an enlarged partial cross-sectional view showing another structural example of the electronic device shown in FIG. 1.

FIG. 1 is a plan view of an electronic device according to a first embodiment of the invention. FIG. 2 is a cross-sectional view of the electronic device shown in FIG. 1. FIGS. 3A and 3B are plan views of an oscillating device of the electronic device shown in FIG. 1. FIG. 4 is an enlarged partial cross-sectional view of the electronic device shown in FIG. 1. FIG. 5 is an enlarged partial cross-sectional view showing another structural example of the electronic device shown in FIG. 1. FIGS. 6A to 6C, FIGS. 7A to 7D, and FIGS. 8A and 8B are views for explaining a method for producing the electronic device shown in FIG. 1. It is noted that, hereinafter, a description will be made with the upper side and the lower side in FIG. 2 and FIGS. 4 to 8B being referred to as "upper" and "lower", respectively, for convenience of description.

1. Electronic Device

First, an electronic device of the embodiment of the invention will be described.

As shown in FIG. 1, an electronic device 100 includes a package 200 and an oscillating device (a piezoelectric device) 300 as an electronic component housed in the package 200.

Oscillating Device

FIG. 3A is a plan view from above of the oscillating device 300, and FIG. 3B is a perspective view (a plan view) from above of the oscillating device 300.

As shown in FIGS. 3A and 3B, the oscillating device 300 includes a piezoelectric substrate 310 whose plan view shape is a rectangular (oblong) plate, and a pair of excitation electrodes 320 and 330 formed on a surface of the piezoelectric substrate 310.

The piezoelectric substrate 310 is a quartz crystal plate which mainly vibrates in a thickness shear vibration mode. In this embodiment, as the piezoelectric substrate 310, a quartz crystal plate which is cut out at a cut angle called AT cut is used. The "AT cut" refers to cutting out of a quartz crystal in such a manner that the quartz crystal has a principal plane (a principal plane including an X axis and a Z' axis) obtained by rotating a plane (a Y plane) including the X axis and a Z axis as crystal axes of quartz crystal about the X axis at an angle of approximately 35° 15' from the Z axis in a counterclockwise direction.

In the piezoelectric substrate 310 having such a structure, its longitudinal direction coincides with the X axis which is a crystal axis of quartz crystal.

The excitation electrode 320 includes an electrode section 321 formed on an upper surface of the piezoelectric substrate 310, a bonding pad 322 formed on a lower surface of the piezoelectric substrate 310, and a wiring 323 electrically connecting the electrode section 321 to the bonding pad 322.

On the other hand, the excitation electrode 330 includes an electrode section 331 formed on a lower surface of the piezoelectric substrate 310, a bonding pad 332 formed on a lower surface of the piezoelectric substrate 310, and a wiring 333 electrically connecting the electrode section 331 to the bonding pad 332.

The electrode sections 321 and 331 are provided facing each other through the piezoelectric substrate 310, and have substantially the same shape. That is, in plan view of the piezoelectric substrate 310, the electrode sections 321 and 331 are placed so as to overlap each other and formed such that their outlines coincide with each other. Further, the bonding pads 322 and 332 are formed spaced apart from each other at an end portion on a right side of FIG. 3B of a lower surface of the piezoelectric substrate 310.

Such excitation electrodes 320 and 330 can be formed, for example, as follows. After an underlayer of nickel (Ni) or chromium (Cr) is formed on the piezoelectric substrate 310 by vapor deposition or sputtering, an electrode layer of gold (Au) is formed on the underlayer by vapor deposition or sputtering, followed by patterning into a desired shape using photolithography or any of a variety of etching techniques. By forming the underlayer, the adhesiveness between the piezoelectric substrate 310 and the electrode layer is improved, and therefore, an oscillating device 300 having high reliability can be obtained.

The structure of the excitation electrodes 320 and 330 is not limited to the structure described above, and for example, the underlayer may be omitted, and as the constituent material, another conductive material (e.g., any of a variety of metal materials such as silver (Ag), copper (Cu), tungsten (W), and molybdenum (Mo)) may be used.

Such an oscillating device 300 is fixed to the package 200 through a pair of conductive adhesives 291 and 292.

Package Including Base Substrate (Base Substrate According to the Invention)

As shown in FIGS. 1 and 2, the package 200 includes a plate-shaped insulator substrate 21, a cap-shaped lid 230 having a recess which is open toward a lower side, and a bonding layer 250 which is interposed between the insulator substrate 21 and the lid 230 and bonds these two members. In such a package 200, by closing the opening of the recess with the insulator substrate 21, a storage space S in which the oscillating device 300 described above is stored is formed. A principal portion of a base substrate 210 is constituted by the insulator substrate 21, the bonding layer 250 provided on the insulator substrate 21, etc.

The insulator substrate 21 and the lid 230 have a substantially rectangular (oblong) shape in plan view.

The lid 230 includes a main body 231 having a bottomed cylindrical shape and a flange 233 formed on a lower edge of the main body 231 (i.e., a circumference of an opening of the main body 231). Further, on a lower surface of the flange 233, a solder material 235 is provided in the form of a film (a layer) so as to cover the circumference of the opening. The solder material 235 can be formed on a lower surface of the flange 233 by, for example, a screen printing method, etc.

Such a lid 230 is bonded to the insulator substrate 21 through the bonding layer 250 by welding the solder material 235 and the bonding layer 250. The solder material 235 is not particularly limited, and a gold solder, a silver solder, etc. can be used, however, it is preferred to use a silver solder. Further, the melting point of the solder material 235 is not particularly limited, but is preferably about 800° C. or higher and 1000° C. or lower. If the solder material has such a melting point, a package 200 which is suitable for laser sealing, etc. is formed.

A constituent material of such an insulator substrate 21 is not particularly limited as long as it has an insulating property, and for example, any of a variety of ceramics such as oxide-based ceramics, nitride-based ceramics, and carbide-based ceramics, etc. can be used. Further, a constituent material of the lid 230 is not particularly limited, but is preferably a material having a linear expansion coefficient approximate to that of the constituent material of the insulator substrate 21. For example, when a ceramic as described above is used as the constituent material of the insulator substrate 21, an alloy such as kovar is preferably used as the constituent material of the lid 230.

As shown in FIG. 1, on an upper surface (a plane facing the storage space S) of the insulator substrate 21, a pair of connection electrodes 271 and 272 are formed. Further, on a lower surface of the insulator substrate 21, a pair of externally mounted electrodes (not shown) for extracting the connection electrodes 271 and 272 to the outside of the package 200 are formed. The connection electrode 271 and the connection electrode 272 are electrically connected to one of the externally mounted electrodes and the other externally mounted electrode, respectively, through a via hole (not shown) penetrating the insulator substrate 21 in a thickness direction.

In the storage space S, the oscillating device 300 is stored. The oscillating device 300 stored in the storage space S is cantilevered by the insulator substrate 21 through a pair of conductive adhesives 291 and 292. The conductive adhesive 291 is provided in contact with the connection electrode 271 and the bonding pad 322. According to this, the connection electrode 271 and the bonding pad 322 are electrically connected to each other through the conductive adhesive 291. Meanwhile, the other conductive adhesive 292 is provided in contact with the connection electrode 272 and the bonding pad 332. According to this, the connection electrode 272 and the bonding pad 332 are electrically connected to each other through the conductive adhesive 292.

As shown in FIG. 1, the bonding layer 250 is provided in the form of a frame along a peripheral portion of an upper surface of the insulator substrate 21. Further, the bonding layer 250 is provided between the peripheral portion of the insulator substrate 21 and the flange 233 of the lid 230, and the insulator substrate 21 and the lid 230 are bonded to each other at the region where the bonding layer 250 is provided. According to this, the storage space S located in the inner side of the bonding layer 250 can be hermetically sealed.

As shown in FIG. 4, the bonding layer 250 is constituted by a laminate in which three metal layers: a metal layer (a first metal layer) 251, a metal layer (a second metal layer) 252, and a metal layer (a fourth metal layer) 254 are laminated in this order from the side of the insulator substrate 21. Due to a structure of the bonding layer 250 described later, a thermal change of the bonding layer 250 can be suppressed, and also a residual stress is small. Therefore, when the base substrate 210 and the lid 230 are bonded to each other through the bonding layer 250, the occurrence of a crack in the bonding layer 250 can be prevented. Accordingly, airtightness of the storage space S can be reliably maintained.

The metal layer 251 is formed by subjecting a first film containing, as a main component, a metal containing at least one of tungsten and molybdenum and having a melting point of 1000° C. or higher and a second film containing nickel (Ni) as a main component and also containing boron (B) and formed on the first film to a sintering treatment (a heat treatment). A method for forming the first film or the second film is not particularly limited, however, as for the second film, plating is preferred, and electroless plating is particularly preferred. As for the first film, a printing method is preferably used. By using these methods, the first film and the second film can be easily formed. Incidentally, the sintering treatment will be described in detail later.

In the metal as the main component of the first film, either one or both of tungsten and molybdenum is/are contained. The melting point of the metal as the main component of the first film is 1000° C. or higher, but is preferably about 1200° C. or higher and 4000° C. or lower, more preferably about 1300° C. or higher and 3500° C. or lower.

If the melting point thereof is lower than 1000° C., there is a possibility that the occurrence of a crack in the bonding layer 250 cannot be effectively prevented.

The thickness of the first film is not particularly limited, but is preferably about 1 μm more and 50 μm or less, more preferably about 10 μm or more and 30 μm or less.

The concentration of boron in the second film is preferably 3% by mass or less, more preferably 0.1% by mass or more and 2% by mass or less. If the concentration of boron in the second film exceeds 3% by mass, there is a possibility that the occurrence of a crack in the bonding layer 250 cannot be effectively prevented depending on the other conditions.

The thickness of the second film is not particularly limited, but is preferably about 0.1 μm or more and 5 μm or less, more preferably about 0.5 μm or more and 2 μm or less.

The second film contains nickel as the main component, and may contain, for example, another metal material such as cobalt (Co), tungsten (W), or molybdenum (Mo) other than boron.

Here, by performing the sintering treatment of the first film and the second film, the metal in the first film is diffused in the second film, and also nickel in the second film is diffused in the first film, thereby each forming an alloy, and as a result, the metal layer 251 is formed. In this case, the thickness of the first film is larger than that of the second film, and therefore, the entire portion of the second film is converted into an alloy, and in the first film, a portion from a boundary surface between the first film and the second film to a predetermined thickness is converted into an alloy. According to this, boron is released, and also a gas such as a $H_2$—$H_2O$ gas in the coating film is released. Accompanying this, a residual stress can be decreased. Further, even if a residual stress is large, a crack hardly occurs in the metal layer 251 when the base substrate 210 and the lid 230 are bonded to each other through the bonding layer 250. As a result, the occurrence of a crack in the bonding layer 250 can be prevented.

The metal layer 252 is a layer containing palladium (Pd) as a main component. By providing this metal layer 252, the metal layer 252 functions as a barrier layer when the base substrate 210 and the lid 230 are bonded to each other through the bonding layer 250, and therefore, nickel in a lower layer of the metal layer 252 can be prevented from moving to an upper layer of the metal layer 252. As a result, the formation of a nickel oxide on the bonding layer 250 can be prevented. According to this, airtightness of the storage space S can be reliably maintained. A method for forming this metal layer 252 is not particularly limited, but is preferably plating, and particularly preferably electroless plating. According to this, the metal layer 252 can be easily formed.

The concentration of a component other than palladium in the metal layer 252 is preferably 5% by mass or less (including 0% by mass), and more preferably 0% by mass. According to this, the function of the metal layer 252 as the barrier layer can be enhanced. In the case where the concentration of the component other than palladium in the metal layer 252 is 0% by mass, even if the thickness of the metal layer 252 is further decreased, the metal layer 252 can function as the barrier layer.

The component other than palladium in the metal layer 252 is not particularly limited, but is, for example, phosphorus (P) in the case where the metal layer 252 is formed by electroless plating.

The thickness of the metal layer 252 is not particularly limited, but is preferably about 0.05 μm or more and 1 μm or less, more preferably about 0.1 μm or more and 0.5 μm or less.

Further, the metal layer 254 is a layer containing gold as a main component, and constitutes the outermost layer of the bonding layer 250. According to this, the wettability of the bonding layer 250 can be enhanced. A method for forming this metal layer 254 is not particularly limited, but is preferably plating, and particularly preferably electroless plating. By using this method, the metal layer 254 can be easily formed.

The thickness of the metal layer 254 is not particularly limited, but is preferably about 0.05 μm or less, more preferably about 0.01 μm or more and 0.05 μm or less.

The metal layer 254 may be omitted. In this case, the cost can be reduced.

As shown in FIG. 5, the bonding layer 250 having another structure is constituted by a laminate in which four metal layers: a metal layer (a first metal layer) 251, a metal layer (a third metal layer) 253, a metal layer (a second metal layer) 252, and a metal layer (a fourth metal layer) 254 are laminated in this order from the side of the insulator substrate 21. The metal layers 251, 252, and 254 of this bonding layer 250 are the same as those of the bonding layer 250 shown in FIG. 4 described above, and therefore, a description thereof is omitted, and the metal layer 253 will be described below.

The metal layer 253 is a layer composed of an alloy containing nickel as a main component and also containing boron. By providing this metal layer 253, the thickness of the bonding layer 250 can be increased. A method for forming this metal layer 253 is not particularly limited, but is preferably plating, and particularly preferably electroless plating. By using this method, the metal layer 253 can be easily formed.

The concentration of boron in the metal layer 253 is preferably 3% by mass or less, more preferably 0.1% by mass or more and 2% by mass or less. If the concentration of boron in the metal layer 253 exceeds 3% by mass, there is a possibility that the occurrence of a crack in the bonding layer 250 cannot be effectively prevented depending on the other conditions.

The thickness of the metal layer 253 is not particularly limited, but is preferably about 0.5 µm or less, more preferably about 0.1 µm or more and 0.3 µm or less.

The metal layer 253 contains nickel as the main component, and may contain, for example, another metal material such as cobalt (Co), tungsten (W), or molybdenum (Mo) other than boron.

The metal layer 254 may be omitted. In this case, the cost can be reduced.

2. Method for Producing Electronic Device (Method for Producing Base Substrate According to the Invention)

Next, a method for producing an electronic device 100 will be described. The method for producing an electronic device 100 includes: preparing an insulator substrate 21; forming a first film containing, as a main component, a metal having a melting point of 1000° C. or higher on (a principal surface of) the insulator substrate 21; forming a second film composed of an alloy containing nickel as a main component and also containing boron on the first film; forming a first metal layer 251 by performing a sintering treatment (a heat treatment) of the first film and the second film; forming a second metal layer 252 containing palladium as a main component on the first metal layer 251, thereby obtaining a base substrate 210; placing an electronic component on the base substrate 210; placing a lid 230 on the insulator substrate 21 through a bonding layer 250 (e.g., the first metal layer 251 and the second metal layer 252); and bonding the lid 230 to the base substrate 210 through the bonding layer 250.

Hereinafter, the method for producing an electronic device will be described in detail, however, in the following description, for convenience of description, a method in which the bonding layer 250 is configured to have a structure shown in FIG. 4 and to use tungsten as the metal having a melting point of 1000° C. or higher will be described as a representative.

Figure 6A:
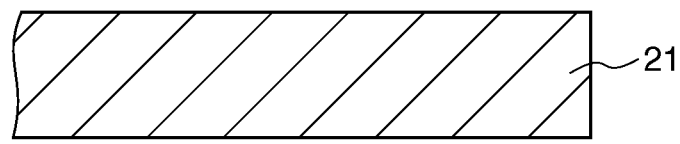
FIGS. 6A to 6C are views for explaining a method for producing the electronic device shown in FIG. 1.

First, as shown in FIG. 6A, a plate-shaped insulator substrate 21 is prepared. The insulator substrate 21 is obtained by shaping a mixture including a starting material powder containing a ceramic or a glass, an organic solvent, and a binder into a sheet by a doctor blade method, etc., thereby obtaining a ceramic green sheet, firing the obtained ceramic green sheet, and then, forming a through-hole at a desired position (where a via hole is formed). At this time, it is also possible to use a laminate in which a plurality of ceramic green sheets are laminated.

Figure 6B:
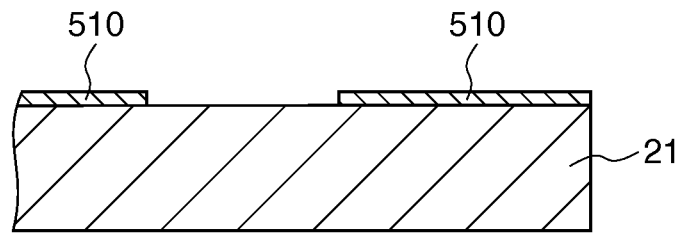

Subsequently, as shown in FIG. 6B, a paste of tungsten (W), molybdenum (Mo), or the like is patterned by a printing method in regions where a bonding layer 250, connection electrodes 271 and 272, and the externally mounted electrodes described above are desired to be formed, and also is filled in the through-hole (at a position where a via hole is formed), and the paste is fired along with the insulator substrate 21, whereby a coating film (a first film) 510 is formed on the insulator substrate 21. The thickness of the coating film 510 is as described above.

Figure 6C:
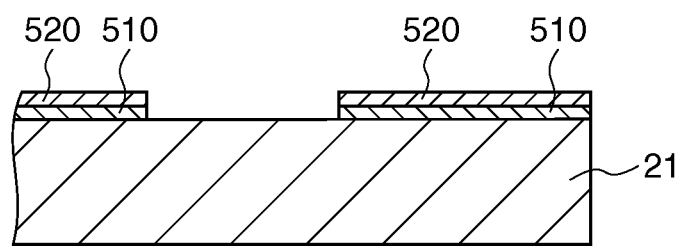

Subsequently, as shown in FIG. 6C, nickel-boron alloy plating is performed by electroless nickel-boron alloy plating, whereby a plated coating film (a second film) 520 is formed on the coating film 510. The thickness of the plated coating film 520 is as described above.

Figure 7A:
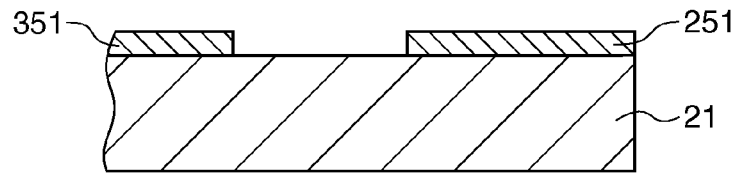
FIGS. 7A to 7D are views for explaining a method for producing the electronic device shown in FIG. 1.

Subsequently, the coating film 510 and the plated coating film 520 are subjected to a sintering treatment (a heat treatment) in a given atmosphere. According to this, as shown in FIG. 7A, tungsten in the coating film 510 is diffused in the plated coating film 520, and also nickel in the plated coating film 520 is diffused in the coating film 510, thereby each forming an alloy, and as a result, metal layers 251 and 351 are formed. At this time, in the plated coating film 520, the entire portion is converted into an alloy, and in the coating film 510, a portion from a boundary surface between the coating film 510 and the plated coating film 520 to a predetermined thickness is converted into an alloy.

Here, a portion formed in a region corresponding to the bonding layer 250 of the coating film 510 and the plated coating film 520 becomes the metal layer 251, and a portion formed in a region corresponding to the connection electrodes 271 and 272 of the coating film. 510 and the plated coating film 520 becomes the metal layer 351.

The conditions for this sintering treatment are not particularly limited and are appropriately set according to the respective conditions such as the melting points of the metal materials in the coating film 510 and the plated coating film 520, however, the heating temperature is preferably 850° C. or higher, more preferably 950° C. or higher, and further more preferably 900° C. or higher and 1000° C. or lower.

Here, a case where tungsten is used as the metal having a melting point of 1000° C. or higher is described as a representative, and therefore, a preferred upper limit of the heating temperature is the above-described temperature, however, for example, in the case where molybdenum is used, the heating temperature is preferably 1000° C. or lower.

Figure 7B:
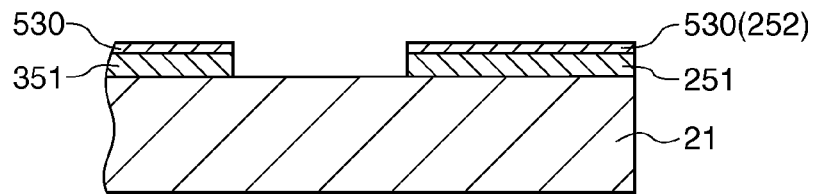

Subsequently, as shown in FIG. 7B, pure palladium plating is performed by electroless pure palladium plating, whereby a coating film 530 is formed on the metal layers 251 and 351. The thickness of the plated coating film 530 is as described above.

Here, a portion formed in a region corresponding to the bonding layer 250 of the plated coating film 530 becomes a metal layer 252.

Figure 7C:
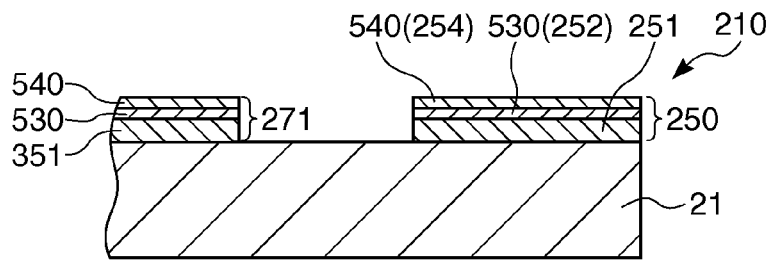

Subsequently, as shown in FIG. 7C, gold plating is performed by electroless gold plating, whereby a plated coating film 540 is formed on the plated coating film 530. The thickness of the plated coating film 540 is as described above.

Here, a portion formed in a region corresponding to the bonding layer 250 of the plated coating film 540 becomes a metal layer 254. According to this, the bonding layer 250 composed of the metal layers 251, 252, and 254, and the connection electrodes 271 and 272 having the same structure as the bonding layer 250 are obtained, whereby the base substrate 210 is obtained.

Figure 7D:
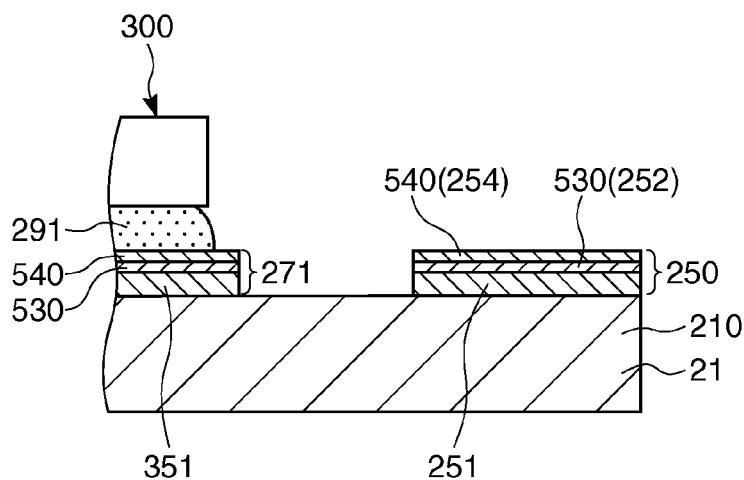

Subsequently, as shown in FIG. 7D, an oscillating device 300 is mounted on the insulator substrate 21, that is, on the base substrate 210 through conductive adhesives 291 and 292. According to this, a bonding pad 322 and the connection electrode 271 are electrically connected to each other through the conductive adhesive 291, and a bonding pad 332 and the connection electrode 272 are electrically connected to each other through the conductive adhesive 292. Incidentally, in FIG. 7D, the illustration of the bonding pad 332, the connection electrode 272, and the conductive adhesive 292 is omitted.

Figure 8A:
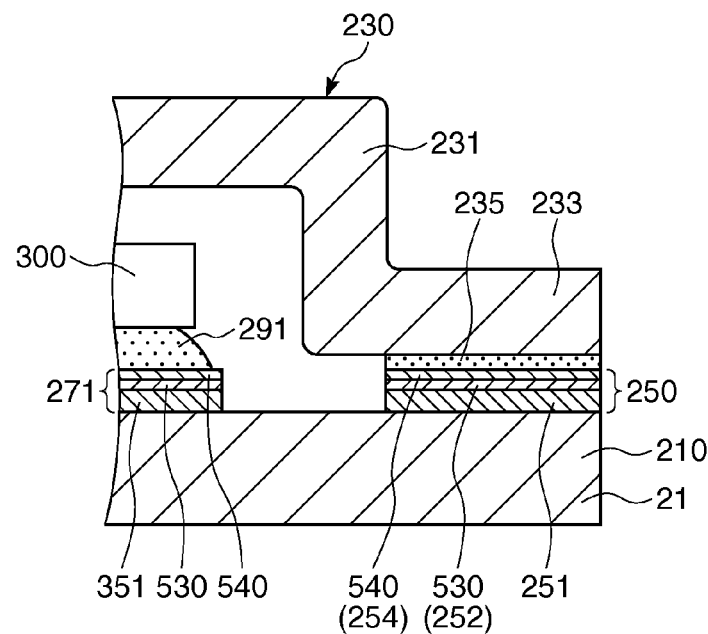
FIGS. 8A and 8B are views for explaining a method for producing the electronic device shown in FIG. 1.

Subsequently, as shown in FIG. 8A, a lid 230 is prepared. On a lower surface of a flange 233 of the lid 230, a film-shaped solder material (silver solder) 235 is provided. The melting point of the solder material 235 is not particularly limited, but is preferably about 800° C. or higher and 1000° C. or lower. Then, the lid 230 is placed on the base substrate 210.

Figure 8B:
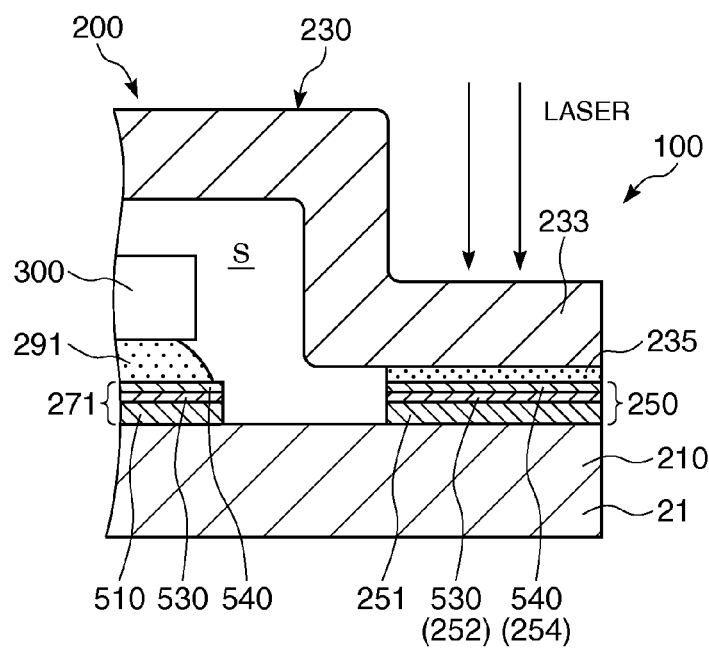

Subsequently, as shown in FIG. 8B, the flange 233 is irradiated with a laser from above the lid 230 so as to locally heat the irradiated portion. According to this, the solder material 235 in the portion irradiated with a laser and a region on the lid side of the bonding layer 250 (in other words, at least the metal layer 252) are melted, whereby the solder material 235 and the bonding layer 250 are bonded to each other. At this time, the metal layer 254 is diffused in the solder material 235 or the metal layer 252, and therefore substantially disappears. By performing such laser irradiation throughout the entire circumference of the flange 233, the solder material 235 and the bonding layer 250 are bonded to each other throughout the entire circumference of the flange 233, whereby the lid 230 and the base substrate 210 are hermetically sealed.

As described above, the electronic device 100 is produced.

In the case where as the bonding layer 250, a layer having a structure shown in FIG. 5 is used, the method for producing an electronic device 100 further includes forming a metal layer 253 containing nickel and boron on the metal layer 251 after performing the sintering treatment.

As described above, according to such a production method, this bonding layer 250 has a small residual stress, and therefore, when the base substrate 210 and the lid 230 are bonded to each other through the bonding layer 250, the occurrence of a crack in the bonding layer 250 can be prevented. According to this, airtightness of the storage space S can be reliably maintained.

In particular, by performing a sintering treatment, the residual stress can be decreased, and further, even if the residual stress is large, a crack hardly occurs in the metal layer 251 when the base substrate 210 and the lid 230 are bonded to each other through the bonding layer 250, and therefore, the occurrence of a crack in the bonding layer 250 can be more reliably prevented.

In addition, by providing the metal layer 252, when the base substrate 210 and the lid 230 are bonded to each other through the bonding layer 250, the metal layer 252 functions as a barrier layer, and therefore nickel in a lower layer of the metal layer 252 can be prevented from moving to an upper layer of the metal layer 252. As a result, the formation of a nickel oxide on the bonding layer 250 can be prevented. Accordingly, airtightness of the storage space S can be more reliably maintained.

A method for bonding the base substrate 210 and the lid 230 to each other is not limited to the laser welding described above, and other than this, for example, seam welding, bonding with a low melting point glass, or the like can be used.

Second Embodiment

Next, a second embodiment of the electronic device according to the invention will be described.

Figure 9:
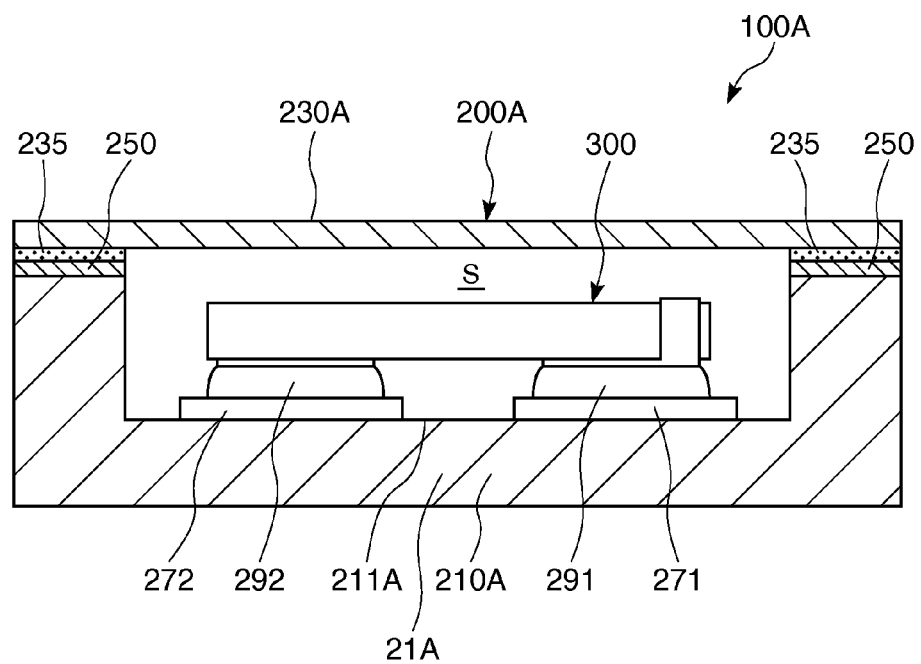
FIG. 9 is a cross-sectional view of an electronic device according to a second embodiment of the invention.

FIG. 9 is a cross-sectional view of an electronic device according to the second embodiment of the invention.

Hereinafter, with respect to the electronic device according to the second embodiment, different points from that of the embodiment described above will be mainly described and a description of the same matters will be omitted.

The electronic device of the second embodiment of the invention is the same as that of the first embodiment described above except that the structure of the package is different. Incidentally, the same components as those of the first embodiment described above are denoted by the same reference signs.

In an electronic device 100A shown in FIG. 9, a package 200A includes an insulator substrate 21A having a recess 211A which is open toward an upper surface, a plate-shaped lid 230A provided so as to cover the opening of the recess 211A, and a bonding layer 250 which bonds the insulator substrate 21A and the lid 230A to each other. The bonding layer 250 is provided on the upper surface of the insulator substrate 21A and in the form of a ring so as to surround the circumference of the recess 211A. Further, on the circumference of the lower surface of the lid 230A, a solder material 235 is provided. Incidentally, by the insulator substrate 21A and the bonding layer 250, etc., provided on the insulator substrate 21A, a principal portion of the base substrate 210A is constituted.

In such a package 200A, an oscillating device 300 is stored in the recess 211A.

According also to the second embodiment, the same effect as that of the first embodiment described above can be exhibited.

Electronic Apparatus

Next, an electronic apparatus (an electronic apparatus according to the invention) to which the electronic device of the embodiment of the invention is applied will be described in detail with reference to FIGS. 10 to 13.

Figure 10:
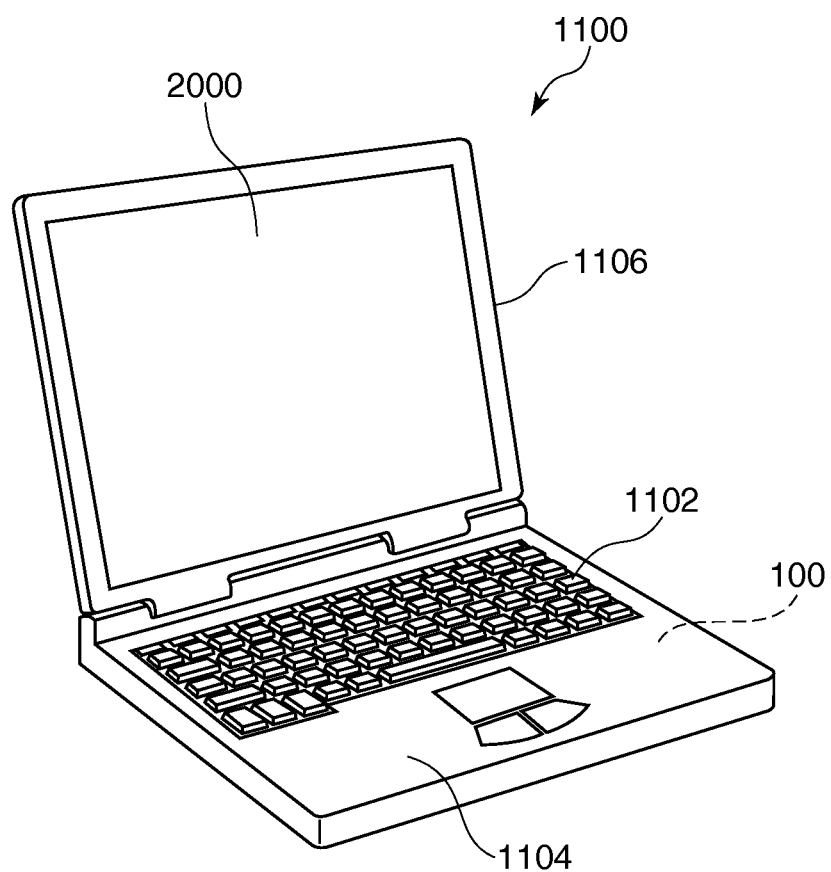
FIG. 10 is a perspective view showing a structure of a personal computer of a mobile type (or a notebook type), to which an electronic apparatus including the electronic device according to the embodiment of the invention is applied.

FIG. 10 is a perspective view showing a structure of a personal computer of a mobile type (or a notebook type), to which an electronic apparatus including the electronic device of the embodiment of the invention is applied. In this drawing, a personal computer 1100 includes a main body 1104 provided with a key board 1102, and a display unit 1106 provided with a display section 2000. The display unit 1106 is supported rotatably with respect to the main body 1104 via a hinge structure. In such a personal computer 1100, an electronic device 100 which functions as a filter, an oscillator, a reference clock, or the like is incorporated.

Figure 11:
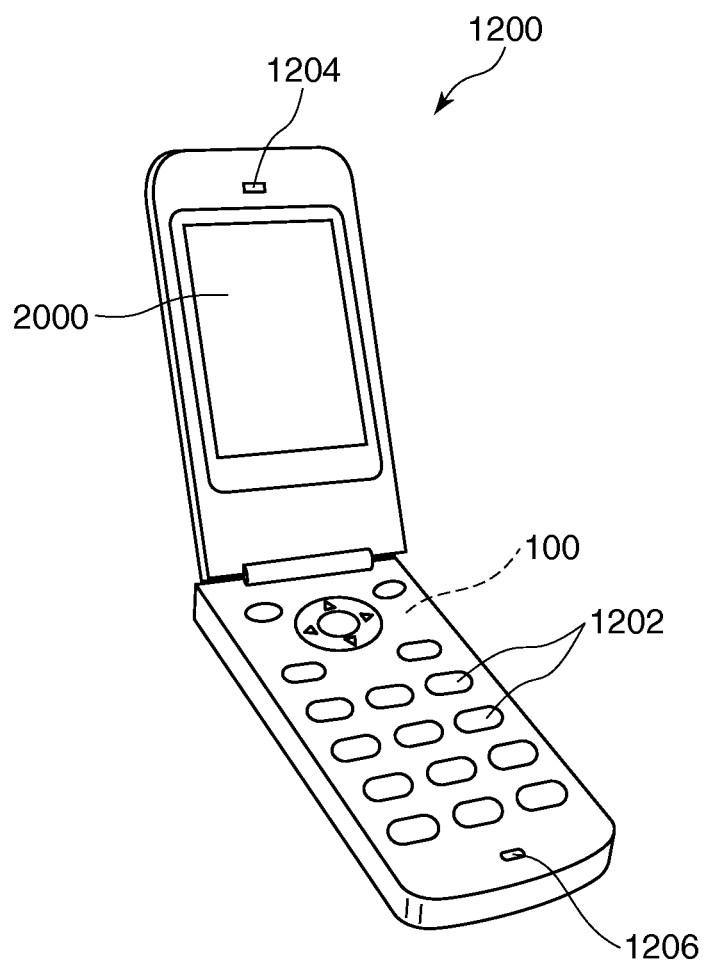
FIG. 11 is a perspective view showing a structure of a cellular phone (including also a PHS), to which an electronic apparatus including the electronic device according to the embodiment of the invention is applied.

FIG. 11 is a perspective view showing a structure of a cellular phone (including also a PHS), to which an electronic apparatus including the electronic device of the embodiment of the invention is applied. In this drawing, a cellular phone 1200 includes a plurality of operation buttons 1202, an earpiece 1204, and a mouthpiece 1206, and between the operation buttons 1202 and the earpiece 1204, a display section 2000 is placed. In such a cellular phone 1200, an electronic device 100 which functions as a filter, an oscillator, or the like is incorporated.

Figure 12:
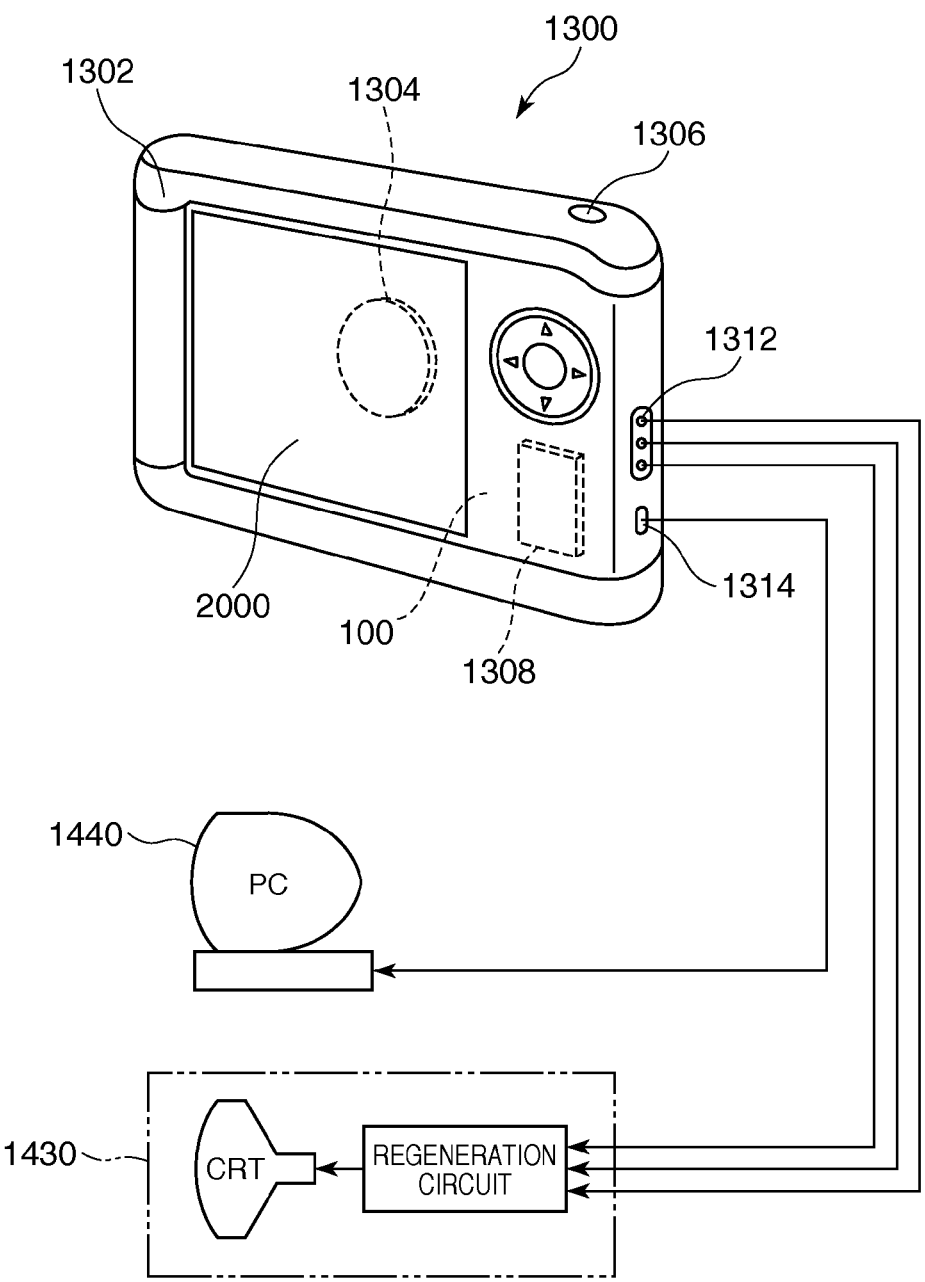
FIG. 12 is a perspective view showing a structure of a digital still camera, to which an electronic apparatus including the electronic device according to the embodiment of the invention is applied.

FIG. 12 is a perspective view showing a structure of a digital still camera, to which an electronic apparatus including the electronic device of the embodiment of the invention is applied. In this drawing, connection to external apparatuses is also briefly shown. A usual camera exposes a silver salt photographic film to light on the basis of an optical image of a subject. On the other hand, a digital still camera 1300 generates an imaging signal (an image signal) by photoelectrically converting an optical image of a subject into the imaging signal with an imaging device such as a CCD (Charge Coupled Device).

On a back surface of a case (body) 1302 in the digital still camera 1300, a display section is provided, and the display section is configured to perform display on the basis of the imaging signal of the CCD. The display section functions as a finder which displays a subject as an electronic image. Further, on a front surface side (on a back surface side in the drawing) of the case 1302, a light receiving unit 1304 including an optical lens (an imaging optical system), a CCD, etc. is provided.

When a person who takes a picture confirms an image of a subject displayed on the display section and pushes a shutter button 1306, an imaging signal of the CCD at that time is transferred to a memory 1308 and stored there. Further, a video signal output terminal 1312 and an input/output terminal 1314 for data communication are provided on a side surface of the case 1302 in the digital still camera 1300. As shown in the drawing, a television monitor 1430 and a personal computer 1440 are connected to the video signal output terminal 1312 and the input/output terminal 1314 for data communication, respectively, as needed. Moreover, the digital still camera 1300 is configured such that the imaging signal stored in the memory 1308 is output to the television monitor 1430 or the personal computer 1440 by means of a predetermined operation. In such a digital still camera 1300, an electronic device 100 which functions as a filter, an oscillator, or the like is incorporated.

Figure 13:
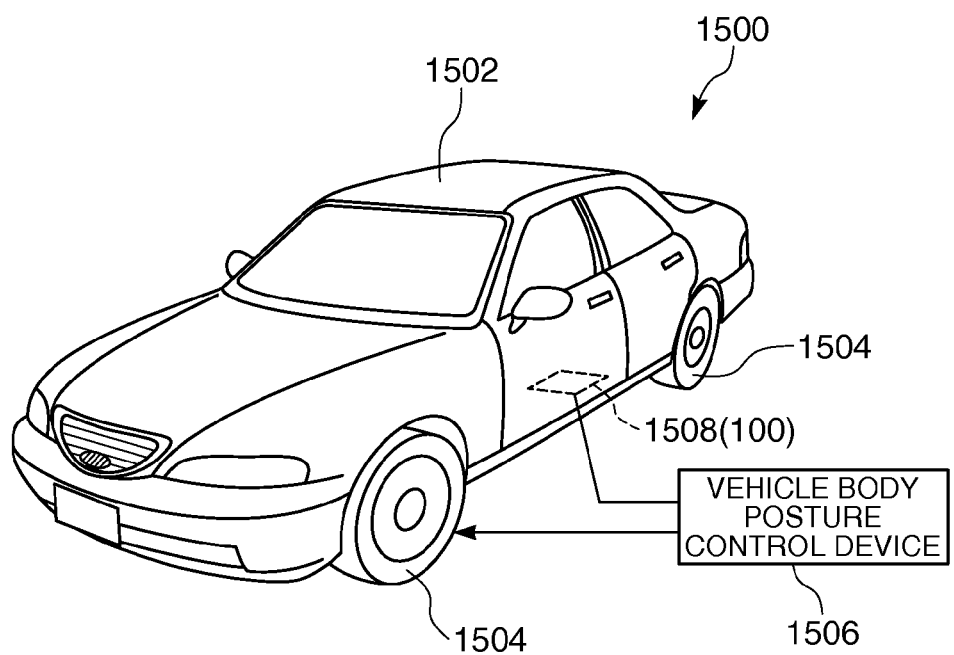
FIG. 13 is a perspective view showing a structure of an automobile, to which an electronic apparatus including the electronic device according to the embodiment of the invention is applied.

FIG. 13 is a perspective view showing a structure of an automobile, to which an electronic apparatus including the electronic device of the embodiment of the invention is applied. In an automobile (a mobile body) 1500, a gyro sensor 1508 which is an electronic device 100 is incorporated. The gyro sensor 1508 detects a posture of a vehicle body 1502. A detection signal from the gyro sensor 1508 is supplied to a vehicle body posture control device 1506. The vehicle body posture control device 1506 controls, on the basis of the detection signal, for example, a stiffness of a suspension according to the posture of the vehicle body 1502, or controls a brake for an individual wheel 1504.

Incidentally, the electronic apparatus including the electronic device of the embodiment of the invention can be applied to, other than the personal computer (mobile personal computer) shown in FIG. 10, the cellular phone shown in FIG. 11, the digital still camera shown in FIG. 12, and the automobile shown in FIG. 13, for example, inkjet type ejection apparatuses (e.g., inkjet printers), laptop personal computers, televisions, video cameras, videotape recorders, car navigation devices, pagers, electronic notebooks (including those having a communication function), electronic dictionaries, pocket calculators, electronic game devices, word processors, work stations, television telephones, television monitors for crime prevention, electronic binoculars, POS terminals, medical devices (e.g., electronic thermometers, blood pressure meters, blood sugar meters, electrocardiogram measuring devices, ultrasound diagnostic devices, and electronic endoscopes), fish finders, various measurement devices, gauges (e.g., gauges for vehicles, airplanes, and ships), flight simulators, robots walking with two legs, radio control helicopters, etc.

EXAMPLES

Next, specific examples of the invention will be described.

Example 1

A base substrate shown in FIG. 4 was produced by setting the conditions as follows.
Metal layer 251
First film: tungsten
Thickness: 10 μm
Second film: a nickel-boron alloy (concentration of boron in the second film: 1% by mass)
Thickness: 2 μm
Metal layer 252: palladium
Thickness: 0.2 μm
Metal layer 254: gold
Thickness: 0.05 μm First, on tungsten formed as a first film on a surface of an insulator substrate, nickel-boron alloy plating was performed by electroless nickel-boron alloy plating, whereby a second film was formed on the first film.

Subsequently, the first film and the second film were subjected to a sintering treatment in a given atmosphere, whereby a metal layer 251 was formed. The heating temperature in the sintering treatment was set to 950° C.

Subsequently, pure palladium plating was performed by electroless pure palladium plating, whereby a metal layer 252 was formed on the metal layer 251.

Subsequently, gold plating was performed by electroless gold plating, whereby a metal layer 254 was formed on the metal layer 252.

The base substrate was obtained in the above-described manner.

Example 2

A base substrate was produced in the same manner as in the above-described Example 1 except that the conditions were changed as follows.
Metal layer 251
First film: tungsten
Thickness: 10 μm
Second film: a nickel-boron alloy (concentration of boron in the second film: 1% by mass)
Thickness: 2 μm
Metal layer 253: a nickel-boron alloy (concentration of boron in the metal layer 253: 1% by mass)
Thickness: 0.5 μm
Metal layer 252: palladium
Thickness: 0.2 μm
Metal layer 254: gold
Thickness: 0.05 μm Example 3

A base substrate was produced in the same manner as in the above-described Example 1 except that the conditions were changed as follows, and a sintering treatment was performed also after forming the metal layer 253 (the condition for the sintering treatment was 950° C.).

Metal layer 251
First film: tungsten
   Thickness: 10 μm
Second film: a nickel-boron alloy (concentration of boron in the second film: 1% by mass)
   Thickness: 2 μm
Metal layer 253: a nickel-boron alloy (concentration of boron in the metal layer 253: 1% by mass)
   Thickness: 2 μm
Metal layer 252: palladium
   Thickness: 0.2 μm

Example 4

A base substrate was produced in the same manner as in the above-described Example 1 except that the conditions were changed as follows.
Metal layer 251
First film: molybdenum
   Thickness: 10 μm
Second film: a nickel-boron alloy (concentration of boron in the second film: 1% by mass)
   Thickness: 2 μm
Metal layer 252: palladium
   Thickness: 0.2 μm
Metal layer 254: gold
   Thickness: 0.05 μm

Example 5

A base substrate was produced in the same manner as in the above-described Example 1 except that the conditions were changed as follows, and a sintering treatment was performed also after forming the metal layer 253 (the condition for the sintering treatment was 950° C.).
Metal layer 251
First film: molybdenum
   Thickness: 10 μm
Second film: a nickel-boron alloy (concentration of boron in the second film: 1% by mass)
   Thickness: 2 μm
Metal layer 253: a nickel-boron alloy (concentration of boron in the metal layer 253: 1% by mass)
   Thickness: 2 μm
Metal layer 252: palladium
   Thickness: 0.2 μm
Metal layer 254: gold
   Thickness: 0.05 μm

Example 6

A base substrate was produced in the same manner as in the above-described Example 1 except that the conditions were changed as follows.
Metal layer 251
First film: molybdenum
   Thickness: 10 μm
Second film: a nickel-boron alloy (concentration of boron in the second film: 3% by mass)
   Thickness: 2 μm
Metal layer 253: a nickel-boron alloy (concentration of boron in the metal layer 253: 3% by mass)
   Thickness: 0.5 μm
Metal layer 252: palladium
   Thickness: 0.2 μm

Example 7

A base substrate was produced in the same manner as in the above-described Example 1 except that the conditions were changed as follows.
Heating temperature in sintering treatment: 900° C.

Example 8

A base substrate was produced in the same manner as in the above-described Example 1 except that the conditions were changed as follows.
Heating temperature in sintering treatment: 850° C.

Comparative Example 1

A base substrate was produced in the same manner as in the above-described Example 1 except that the conditions were changed as follows.
Metal layer 251
First film: molybdenum
   Thickness: 10 μm
Second film: a nickel-boron alloy (concentration of boron in the second film: 3% by mass)
   Thickness: 2 μm
Layer corresponding to the metal layer 253: a nickel-phosphorus alloy (concentration of phosphorus in the metal layer: 8 to 10% by mass)
   Thickness: 5
Metal layer 252: palladium
   Thickness: 0.2
Metal layer 254: gold
   Thickness: 0.05
First, a first film formed on an insulator substrate was plated with a nickel-boron alloy by electroless nickel-boron alloy plating, whereby a second film was formed on the first film.

Subsequently, the first film and the second film were subjected to a sintering treatment in a given atmosphere, whereby a metal layer 251 was formed. The heating temperature in the sintering treatment was set to 950° C.

Subsequently, on the thus formed metal layer 251, a nickel-phosphorus alloy was formed, whereby a metal layer 253 was formed.

Subsequently, pure palladium plating was performed by electroless pure palladium plating, whereby a metal layer 252 was formed on the metal layer 253.

Subsequently, gold plating was performed by electroless gold plating, whereby a metal layer 254 was formed on the metal layer 252.

Comparative Example 2

A base substrate was produced in the same manner as in the above-described Example 1 except that the conditions were changed as follows and the sintering treatment was not performed.
Metal layer on the insulator substrate side: a nickel-phosphorus alloy (concentration of phosphorus in the metal layer: 8% by mass)
   Thickness: 5 μm
Intermediate metal layer: a palladium-phosphorus alloy (concentration of phosphorus in the metal layer: 3% by mass)
   Thickness: 0.2 μm
Uppermost metal layer: gold
   Thickness: 0.05 μm First, nickel-phosphorus alloy plating was performed by electroless nickel-phosphorus alloy plating, whereby a metal layer was formed on an insulator substrate.

Subsequently, palladium-phosphorus alloy plating was performed by electroless palladium-phosphorus alloy plating, whereby a metal layer was formed on the above metal layer.

Subsequently, gold plating was performed by electroless gold plating, whereby a metal layer was formed on the above metal layer.

The base substrate was obtained in the above-described manner.

Evaluation

A lid was bonded to each of the base substrates of Examples 1 to 8 and Comparative Examples 1 and 2 through a bonding layer and a silver solder. The bonding between the base substrate and the lid was performed by laser welding. Then, the following evaluations were performed for the Examples 1 to 8 and Comparative Examples 1 and 2.

Evaluation 1: Occurrence of Crack

For ten samples, the bonding surface was polished, and the cross section was observed by SEM. The evaluation criteria are as follows.

A: There were no samples in which the occurrence of a crack was observed.

B: There were one or more but not more than four samples in which the occurrence of a crack was observed.

C: There were five or more samples in which the occurrence of a crack was observed.

Evaluation 2: Immersion Test

For ten samples, immersion in a liquid under pressure was performed, and leakage of the liquid into the internal space surrounded by the base substrate and the lid was measured. The evaluation criteria are as follows.

A: There were no samples in which the occurrence of leakage of the liquid was observed.

B: There were one or more but not more than four samples in which the occurrence of leakage of the liquid was observed.

C: There were five or more samples in which the occurrence of leakage of the liquid was observed.

TABLE 1

|  | Evaluation 1 | Evaluation 2 |
| --- | --- | --- |
| Example 1 | A | A |
| Example 2 | B | B |
| Example 3 | A | A |
| Example 4 | A | A |
| Example 5 | A | A |
| Example 6 | B | B |
| Example 7 | A | A |
| Example 8 | B | B |
| Comparative Example 1 | C | C |
| Comparative Example 2 | C | C |

As apparent from the above Table 1, favorable results were obtained in the case of Examples 1 to 8.

On the other hand, satisfactory results were not obtained in the case of Comparative Examples 1 and 2.

Hereinabove, the method for producing a base substrate, the method for producing an electronic device, the base substrate, and the electronic device of the invention have been described based on the embodiments shown in the drawings, but it should be noted that the invention is not limited to the embodiments. The respective components can be replaced with components having an arbitrary structure capable of functioning in the same manner. Further, any other arbitrary structure or step may be added to the invention. In addition, the respective embodiments may be appropriately combined.

The entire disclosure of Japanese Patent Application No. 2012-148512, filed Jul. 2, 2012 is expressly incorporated by reference herein.

What is claimed is:

1. A method for producing a base substrate, comprising:
   preparing an insulator substrate;
   forming a first film containing, as a main component, a metal that contains at least one of tungsten and molybdenum and has a melting point of 1000° C. or higher above the insulator substrate;
   forming a second film containing nickel as a main component and also containing boron on the first film;
   forming a first metal layer by performing a sintering treatment of the first film and the second film; and
   forming a second metal layer containing palladium as a main component above the first metal layer.

2. The method for producing a base substrate according to claim 1, wherein the method further comprises forming a third metal layer containing nickel and boron and having a thickness of 0.5 μm or less above the first metal layer after performing the sintering treatment and before forming the second metal layer, and the second metal layer is formed above the third metal layer.

3. The method for producing a base substrate according to claim 1, wherein a concentration of boron in the second film is 3% by mass or less.

4. The method for producing a base substrate according to claim 1, wherein the method further comprises forming a fourth metal layer containing gold above the second metal layer.

5. The method for producing a base substrate according to claim 1, wherein a concentration of a component other than palladium in the second metal layer is 5% by mass or less.

6. A method for producing an electronic device, comprising:
   preparing an insulator substrate;
   forming a first film containing, as a main component, a metal having a melting point of 1000° C. or higher above the insulator substrate;
   forming a second film containing nickel as a main component and also containing boron on the first film;
   forming a first metal layer by performing a sintering treatment of the first film and the second film;
   forming a second metal layer containing palladium as a main component above the first metal layer, thereby obtaining a base substrate;
   placing an electronic component above the base substrate; and
   bonding a lid to the base substrate through the first metal layer and the second metal layer.

* * * * *